(12) United States Patent
Zhang et al.

(10) Patent No.: US 12,033,887 B2
(45) Date of Patent: Jul. 9, 2024

(54) ASSEMBLY OF DISPLAY WITH COLOR CONVERSION LAYER AND ISOLATION WALLS

(71) Applicant: Applied Materials, Inc., Santa Clara, CA (US)

(72) Inventors: Daihua Zhang, Los Altos, CA (US); Yingdong Luo, Newark, CA (US); Mingwei Zhu, San Jose, CA (US); Hou T. Ng, Campbell, CA (US); Sivapackia Ganapathiappan, Los Altos, CA (US); Nag B. Patibandla, Pleasanton, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 18/349,032

(22) Filed: Jul. 7, 2023

(65) Prior Publication Data

US 2023/0352632 A1   Nov. 2, 2023

Related U.S. Application Data

(60) Continuation of application No. 17/389,029, filed on Jul. 29, 2021, now Pat. No. 11,888,093, which is a
(Continued)

(51) Int. Cl.
*H01L 21/70* (2006.01)
*H01L 21/02* (2006.01)
(Continued)

(52) U.S. Cl.
CPC ........ *H01L 21/70* (2013.01); *H01L 21/02104* (2013.01); *H01L 21/027* (2013.01);
(Continued)

(58) Field of Classification Search
CPC ....... H01L 33/00; H01L 33/44; H01L 27/153; H01L 21/02104; H01L 21/027;
(Continued)

(56) References Cited

U.S. PATENT DOCUMENTS 6,635,363 B1   10/2003   Duclos et al.
8,227,269 B2   7/2012    Chen et al.
(Continued)

FOREIGN PATENT DOCUMENTS

CN   102468415   5/2012
CN   105096749   11/2015
(Continued)

OTHER PUBLICATIONS

Extended European Search Report in European Appln No. 20805153. 2, dated Apr. 28, 2023, 9 pages.
(Continued)

*Primary Examiner* — Shouxiang Hu
(74) *Attorney, Agent, or Firm* — Fish & Richardson P.C.

(57) ABSTRACT

A multi-color display includes a backplane having backplane circuitry, an array of micro-LEDs electrically integrated with backplane circuitry of the backplane, a color conversion layer over each of a plurality of light emitting diodes, and a plurality of isolation walls separating adjacent micro-LEDs of the array.

16 Claims, 6 Drawing Sheets

Related U.S. Application Data division of application No. 16/412,222, filed on May 14, 2019, now Pat. No. 11,094,530.

(51) Int. Cl.
| | |
|---|---|
| *H01L 21/027* | (2006.01) |
| *H01L 25/075* | (2006.01) |
| *H01L 27/15* | (2006.01) |
| *H01L 33/00* | (2010.01) |
| *H01L 33/44* | (2010.01) |
| *H01L 33/50* | (2010.01) |
| *H01L 33/58* | (2010.01) |
| *H01L 33/62* | (2010.01) |

(52) U.S. Cl.
CPC ........ *H01L 21/707* (2013.01); *H01L 25/0753* (2013.01); *H01L 27/153* (2013.01); *H01L 33/00* (2013.01); *H01L 33/0093* (2020.05); *H01L 33/44* (2013.01); *H01L 33/505* (2013.01); *H01L 33/58* (2013.01); *H01L 33/62* (2013.01); *H01L 2933/0041* (2013.01); *H01L 2933/0058* (2013.01); *H01L 2933/0066* (2013.01)

(58) Field of Classification Search
CPC ... H01L 21/70; H01L 21/707; H01L 25/0753; H01L 33/0093; H01L 33/505; H01L 33/58; H01L 33/62; H01L 2933/0041; H01L 2933/0058; H01L 2933/0066; H01L 33/50; H01L 33/504; H01L 25/167; H01L 27/156; H01L 27/1214; H01L 33/005; G09F 9/33; G02B 5/201
See application file for complete search history.

(56) References Cited

U.S. PATENT DOCUMENTS

| | | | |
|---|---|---|---|
| 8,323,748 B2 | 12/2012 | Ling | |
| 8,425,065 B2 | 4/2013 | Ravillisetty et al. | |
| 9,001,288 B2 | 4/2015 | Tsukahara et al. | |
| 9,111,464 B2 | 8/2015 | Bibl et al. | |
| 10,048,530 B1 | 8/2018 | Kim et al. | |
| 10,224,460 B2 | 3/2019 | Bower et al. | |
| 10,636,349 B2* | 4/2020 | Shin | H04N 25/76 |
| 10,784,414 B2 | 9/2020 | Umehara et al. | |
| 11,004,835 B2* | 5/2021 | Pschenitzka | H01L 33/505 |
| 11,094,530 B2 | 8/2021 | Zhang | |
| 11,239,213 B2 | 2/2022 | Zhang et al. | |
| 2006/0105483 A1 | 5/2006 | Leatherdale et al. | |
| 2008/0278068 A1 | 11/2008 | Huang et al. | |
| 2010/0117106 A1 | 5/2010 | Trottier | |
| 2010/0295077 A1 | 12/2010 | Melman | |
| 2011/0273864 A1 | 11/2011 | Izawa et al. | |
| 2012/0037885 A1 | 2/2012 | Schardt et al. | |
| 2012/0086040 A1 | 4/2012 | Lee et al. | |
| 2012/0104439 A1 | 5/2012 | Kim | |
| 2012/0267997 A1 | 10/2012 | Kijima et al. | |
| 2012/0285379 A1 | 11/2012 | Hirakata et al. | |
| 2015/0255505 A1 | 9/2015 | Jeoung et al. | |
| 2016/0181488 A1 | 6/2016 | Saito | |
| 2017/0141169 A1 | 5/2017 | Sim et al. | |
| 2017/0244010 A1 | 8/2017 | Kim et al. | |
| 2017/0309794 A1 | 10/2017 | Von Malm | |
| 2018/0047780 A1 | 2/2018 | Yeon et al. | |
| 2018/0074240 A1 | 3/2018 | Bonar et al. | |
| 2018/0156951 A1 | 6/2018 | Baek et al. | |
| 2018/0190712 A1 | 7/2018 | Xu et al. | |
| 2018/0274753 A1 | 9/2018 | Sakaino et al. | |
| 2018/0277525 A1 | 9/2018 | Cok et al. | |
| 2018/0308420 A1 | 10/2018 | Shin et al. | |
| 2018/0366622 A1 | 12/2018 | Ulmer | |
| 2019/0107755 A1 | 4/2019 | Chen | |
| 2019/0229098 A1 | 7/2019 | Hsieh et al. | |
| 2020/0051959 A1 | 2/2020 | Pschenitzka | |
| 2020/0088920 A1 | 3/2020 | Sakaino et al. | |
| 2020/0119237 A1 | 4/2020 | Kim et al. | |
| 2020/0152841 A1 | 5/2020 | Han et al. | |
| 2020/0365566 A1 | 11/2020 | Zhang et al. | |
| 2020/0365774 A1 | 11/2020 | Zhang et al. | |
| 2021/0320227 A1 | 10/2021 | Kishimoto | |
| 2021/0358742 A1 | 11/2021 | Zhang et al. | |
| 2022/0189933 A1 | 6/2022 | Zhang et al. | |

FOREIGN PATENT DOCUMENTS

| | | |
|---|---|---|
| CN | 106063378 | 10/2016 |
| CN | 106796936 | 5/2017 |
| CN | 107431113 | 12/2017 |
| CN | 109638138 | 4/2019 |
| CN | 108257949 | 2/2020 |
| EP | 2816620 | 12/2014 |
| JP | 2003-046140 | 2/2003 |
| JP | 2004-530255 | 9/2004 |
| JP | 2008-159756 | 7/2008 |
| JP | 2010-267900 | 11/2010 |
| JP | 2017-120363 | 7/2017 |
| KR | 10-2015-0104462 | 9/2015 |
| KR | 10-2018-0017751 | 2/2018 |
| TW | 201033542 | 9/2010 |
| TW | 201611235 | 3/2016 |
| TW | 201728744 | 8/2017 |
| TW | 201737522 | 10/2017 |
| TW | 201840722 | 11/2018 |
| TW | 201904105 | 1/2019 |
| TW | 201911565 | 3/2019 |
| WO | WO 2019/026826 | 2/2019 |
| WO | WO 2019027820 | 2/2019 |

OTHER PUBLICATIONS

International Search Report and Written Opinion in International Appln. No. PCT/US2020/032850, dated Sep. 1, 2020, 12 pages.
Office Action in Korean Appln. No. 10-2021-7040462, dated Sep. 18, 2023, 13 pages (with English summary).
Office Action in Taiwanese Appln. No. 109114709, dated Jan. 4, 2021, 11 pages (with English Search Report).
Office Action in Taiwanese Appln. No. 112111040, dated Mar. 11, 2024, 9 pages (with English summary and search report).
Office Action in Japanese Appln. No. 2023-099192, dated May 7, 2024, 11 pages (with English translation).

\* cited by examiner

ASSEMBLY OF DISPLAY WITH COLOR CONVERSION LAYER AND ISOLATION WALLS

CROSS-REFERENCE TO RELATED APPLICATIONS

This application is a continuation of U.S. application Ser. No. 17/389,029, filed Jul. 29, 2021, which is a divisional of U.S. application Ser. No. 16/412,222, filed on May 14, 2019, the disclosures of which are incorporated by reference.

TECHNICAL FIELD

This disclosure generally relates to fabrication of micro-LED displays.

BACKGROUND

A light emitting diode (LED) panel uses an array of LEDs, with individual LEDs providing the individually controllable pixel elements. Such an LED panel can be used for a computer, touch panel device, personal digital assistant (PDA), cell phone, television monitor, and the like.

An LED panel that uses micron-scale LEDs based on III-V semiconductor technology (also called micro-LEDs) would have a variety of advantages as compared to OLEDs, e.g., higher energy efficiency, brightness, and lifetime, as well as fewer material layers in the display stack which can simplify manufacturing. However, there are challenges to fabrication of micro-LED panels. Micro-LEDs having different color emission (e.g., red, green and blue pixels) need to be fabricated on different substrates through separate processes. Integration of the multiple colors of micro-LED devices onto a single panel requires a pick-and-place step to transfer the micro-LED devices from their original donor substrates to a destination substrate. This often involves modification of the LED structure or fabrication process, such as introducing sacrificial layers to ease die release. In addition, stringent requirements on placement accuracy (e.g., less than 1 um) limit either the throughput, the final yield, or both.

An alternative approach to bypass the pick-and-place step is to selectively deposit color conversion agents (e.g., quantum dots, nanostructures, florescent materials or organic substances) at specific pixel locations on a substrate fabricated with monochrome LEDs. The monochrome LEDs can generate relatively short wavelength light, e.g., purple or blue light, and the color conversion agents can convert this short wavelength light into longer wavelength light, e.g., red or green light for red or green pixels. The selective deposition of the color conversion agents can be performed using high-resolution shadow masks or controllable inkjet or aerosol jet printing.

SUMMARY

A method of fabricating a multi-color display includes dispensing a first photo-curable fluid that includes a first color conversion agent over a display having a backplane and an array of light emitting diodes electrically integrated with backplane circuitry of the backplane, activating a first plurality of light emitting diodes in the array of light emitting diodes to illuminate and cure the first photo-curable fluid to form a first color conversion layer over each of the first plurality of light emitting diodes to convert light from the first plurality of light emitting diodes to light of a first color, removing an uncured remainder of the first photo-curable fluid, thereafter dispensing a second photo-curable fluid including a second color conversion agent over the display, activating a second plurality of light emitting diodes in the array of light emitting diodes to illuminate and cure the second photo-curable fluid to form a second color conversion layer over each of the second plurality of light emitting diodes to convert light from the second plurality of light emitting diodes to light of a different second color, and removing an uncured remainder of the second photo-curable fluid.

Implementations may include one or more of the following features.

A third photo-curable fluid may be dispensed over the display. The third photo-curable fluid may including a third color conversion agent. A third plurality of light emitting diodes in the array of light emitting diodes may be activated to illuminate and cure the third photo-curable fluid to form a third color conversion layer over each of the third plurality of light emitting diodes to convert light from the third plurality of light emitting diodes to light of a different third color. An uncured remainder of the third photo-curable fluid may be removed.

The light emitting diodes of the array of light emitting diodes may be configured to generate ultraviolet light. The first color, second color and third color may be selected from blue, green and red. The first color may be blue, the second color may be green, and the third color may be red.

The array of light emitting diodes may include a third plurality of light emitting diodes, and light emitting diodes of the array of light emitting diodes may be configured to generate light of a different third color. No color conversion layer need be formed over the third plurality of light emitting diodes. The light emitting diodes of the array of light emitting diodes may be configured to generate blue or violet light. The first color and second color may be selected from green and red. The first color may be green and the second color may be red.

Dispensing the first photo-curable fluid and dispensing the second photo-curable fluid may include one or more of a spin-on, dipping, spray-on, or inkjet process. Removing the uncured remainder of the first photo-curable fluid and the second photo-curable fluid may include one or more of rinsing and dissolving.

A plurality of isolation walls may be formed on the backplane between adjacent light emitting diodes of the array of light emitting diodes. During activation of the first plurality of light emitting diodes, the isolation walls may block illumination from the first plurality of light emitting diodes from reaching the second plurality of light emitting diodes. The isolation walls may be formed of a photoresist.

At least one of the first photo-curable fluid and the second photo-curable fluid may include a solvent. The solvent may be evaporated. An ultraviolet blocking layer may be formed over the array of light emitting diodes.

Light emitting diodes of the array of light emitting diodes may be are micro-LEDs.

In another aspect, a multi-color display includes a backplane having backplane circuitry, an array of micro-LEDs electrically integrated with backplane circuitry of the backplane, a first color conversion layer over each of a first plurality of light emitting diodes, a second color conversion layer over each of a second plurality of light emitting diodes, and a plurality of isolation walls separating adjacent micro-LEDs of the array. The micro-LEDs of the array are configured to generate illumination of the same wavelength range, the first color conversion layer converts the illumination to light of a first color, and the second color conversion layer converts the illumination to light of a different second color.

Implementations can optionally provide (and are not limited to) one or more of the following advantages.

The processing steps (coating, in-situ curing, and rinsing) support large format and high-throughput operation. Thus, color conversion agents can be selectively formed over an array of micro-LEDs with higher yield and throughput. This may permit multi-color micro-LED displays to be fabricated in a commercially viable manner. Flexible and/or stretchable displays can be fabricated more easily. In-situ curing can automatically ensure alignment accuracy.

The host polymer can serve as a passivation layer for die protection. It is also possible for the host polymer to provide other functions, e.g., an optical functionality, when properly doped with functional ingredients.

Other aspects, features, and advantages will be apparent from the description and drawings, and from the claims.

A variety of implementations are described below. It is contemplated that elements and features of one implementation may be beneficially incorporated in other implementations without further recitation.

BRIEF DESCRIPTION OF THE DRAWINGS

Like reference symbols in the various drawings indicate like elements.

DETAILED DESCRIPTION

As noted above, selective deposition of color conversion agents can be performed using use high-resolution shadow masks or controllable inkjet or aerosol jet printing. Unfortunately, shadow masks are prone to problems with alignment accuracy and scalability, whereas inkjet and aerosol jet techniques suffer from resolution (inkjet), accuracy (inkjet) and throughput (aerosol jet) problems. In order to manufacture micro-LED displays, new techniques are needed to precisely and cost-effectively provide color conversion agents for different colors onto different pixels on a substrate, such as a large area substrate or flexible substrate.

A technique that may address these problems is to coat a layer of photo-curable fluid containing a color conversion agent (CCA) for a first color on a substrate having an array of monochrome micro-LEDs, then turn on selected LEDs to trigger in-situ polymerization and immobilize the CCA in the vicinity of the selected subpixels. The uncured fluid over the non-selected subpixels can be removed, and then the same process can be repeated with CCAs for different colors until all subpixels on the wafer are covered with CCAs of the desired colors. This technique may overcome the challenges in alignment accuracy, throughput and scalability.

Figure 1:
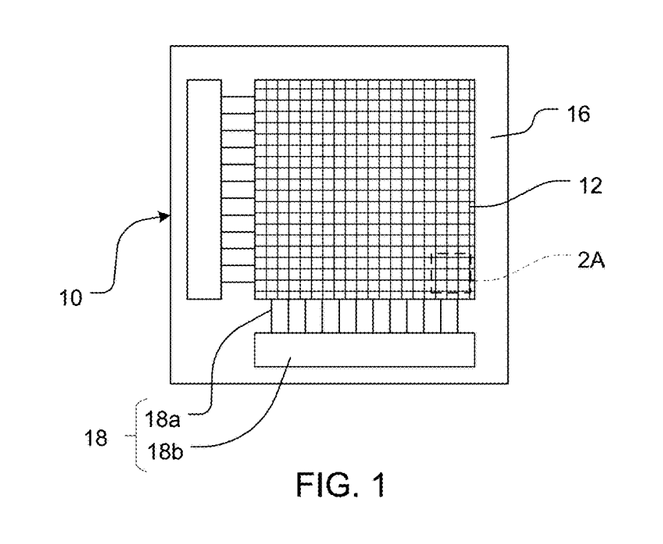
FIG. 1 is a schematic top view of a micro-LED array that has already been integrated with a backplane.

FIG. 1 illustrates a micro-LED display 10 that includes an array 12 of individual micro-LEDs 14 (see FIGS. 2A and 2B) disposed on a backplane 16. The micro-LEDs 14 are already integrated with backplane circuitry 18 so that each micro-LED 14 can be individually addressed. For example, the backplane circuitry 18 can include a TFT active matrix array with a thin-film transistor and a storage capacitor (not illustrated) for each micro-LED, column address and row address lines 18a, column and row drivers 18b, etc., to drive the micro-LEDs 14. Alternatively, the micro-LEDs 14 can be driven by a passive matrix in the backplane circuitry 18. The backplane 16 can be fabricated using conventional CMOS processes.

Figure 2A:
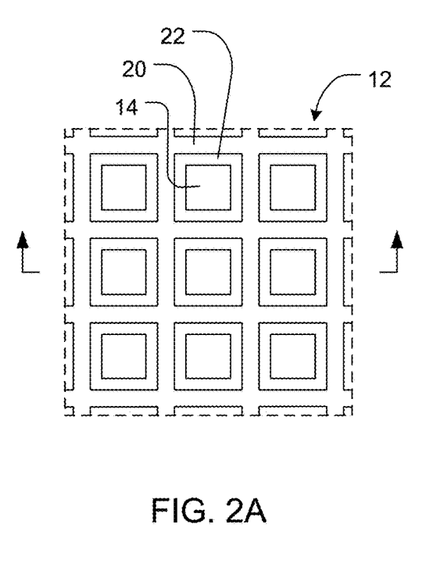
FIG. 2A is a schematic top view of a portion of a micro-LED array.
Figure 2B:
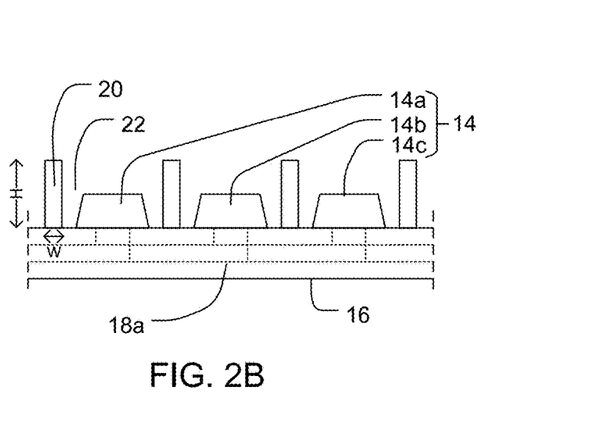
FIG. 2B is a schematic cross-sectional view of the portion of the micro-LED array from FIG. 2A.

FIGS. 2A and 2B illustrate a portion 12a of the micro-LED array 12 with the individual micro-LEDs 14. All of the micro-LEDs 14 are fabricated with the same structure so as to generate the same wavelength range (this can be termed "monochrome" micro-LEDs). For example, the micro-LEDs 14 can generate light in the ultraviolet (UV), e.g., the near ultraviolet, range. For example, the micro-LEDs 14 can generate light in a range of 365 to 405 nm. As another example, the micro-LEDs 14 can generate light in the violet or blue range. The micro-LEDs can generate light having a spectral bandwidth of 20 to 60 nm.

FIG. 2B illustrates a portion of the micro-LED array that can provide a single pixel. Assuming the micro-LED display is a three-color display, each pixel includes three sub-pixels, one for each color, e.g., one each for the blue, green and red color channels. As such, the pixel can include three micro-LEDs 14a, 14b, 14c. For example, the first micro-LED 14a can correspond to a blue subpixel, the second micro-LED 14b can correspond to a green subpixel, and the third micro-LED 14c can correspond to a red subpixel. However, the techniques discussed below are applicable to micro-LED displays that use a larger number of colors, e.g., four or more colors. In this case, each pixel can include four or more micro-LEDs, with each micro-LED corresponding to a respective color. In addition, the techniques discussed below are applicable to micro-LED displays that use just two colors.

In general, the monochrome micro-LEDs 14 can generate light in a wavelength range having a peak with a wavelength no greater than the wavelength of the highest-frequency color intended for the display, e.g., purple or blue light. The color conversion agents can convert this short wavelength light into longer wavelength light, e.g., red or green light for red or green subpixels. If the micro-LEDs generate UV light, then color conversion agents can be used to convert the UV light into blue light for the blue subpixels.

Vertical isolation walls 20 are formed between neighboring micro-LEDs. The isolation walls provide for optical isolation to help localize polymerization and reduce optical crosstalk during the in-situ polymerization discussed below. The isolation walls 20 can be a photoresist or metal, and can be deposited by conventional lithography processes. As shown in FIG. 2A, the walls 20 can form a rectangular array, with each micro-LED 14 in an individual recess 22 defined by the walls 20. Other array geometries, e.g., hexagonal or offset rectangular arrays, are also possible. Possible processes for back-plane integration and isolation wall formation are discussed in more detail below.

The walls can have a height H of about 3 to 20 μm. The walls can have a width W of about 2 to 10 μm. The height H can be greater than the width W, e.g., the walls can have an aspect ratio of 1.5:1 to 5:1. The height H of the wall is sufficient to block light from one micro-LED from reaching an adjacent micro-LED.

Figure 3A:
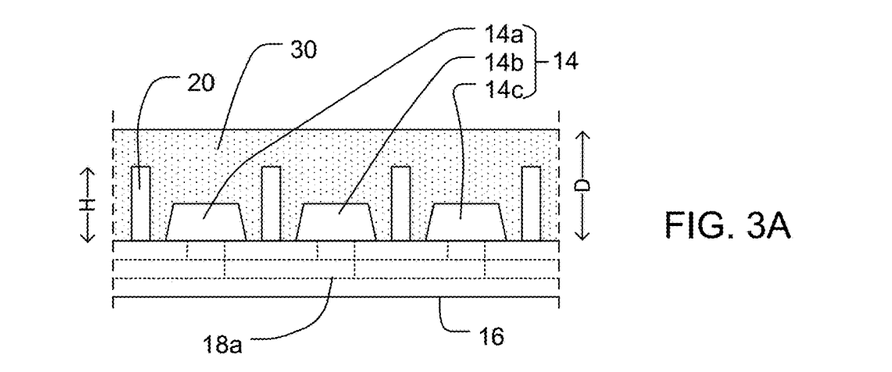
FIGS. 3A-3H illustrate a method of selectively forming color conversion agent (CCA) layers over a micro-LED array.

FIGS. 3A-3H illustrate a method of selectively forming color conversion agent (CCA) layers over a micro-LED array. Initially, as shown in FIG. 3A, a first photo-curable fluid 30a is deposited over the array of micro-LEDs 14 that are already integrated with the backplane circuitry. The first photo-curable fluid 30a can have a depth D greater than a height H of the isolation walls 20.

Figure 4A:
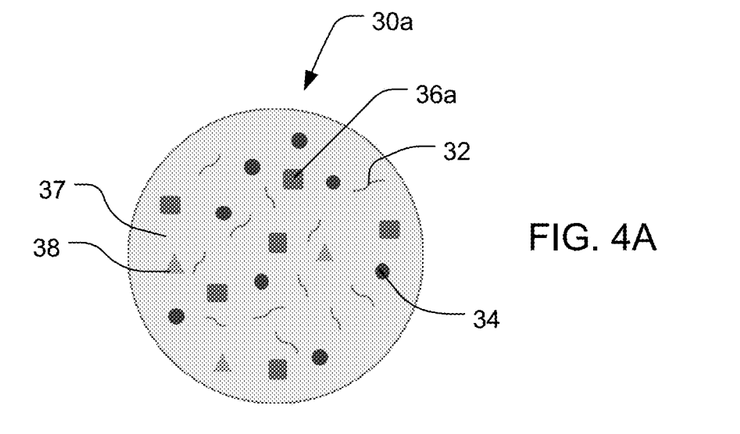
FIGS. 4A-4C illustrate formulations of photo-curable fluid.

Referring to FIG. 4A, the first photo-curable fluid 30a includes at least cross-linkable groups 32, a photo-initiator 34 to trigger polymerization under illumination of a wavelength corresponding to the emission of the micro-LEDs 14, and color conversion agents 36a.

The cross-linkable groups 32 will increase the viscosity of the fluid 30a when subjected to polymerization, e.g., the fluid 30a can be solidified or form gel-like network structures. The cross-linkable groups 32 can be provided by monomers that form a polymer when cured, e.g., acrylate, methacrylate and acrylamide. The cross-linkable groups 32 can be provided by a negative photoresist, e.g., SU-8 photoresist.

Examples of the photo-initiator 34 include Irgacure 184, Irgacure 819, Darocur 1173, Darocur 4265, Dacocur TPO, Omnicat 250 and Omnicat 550.

The color conversion agents 36a is a material that can convert the shorter wavelength light from the micro-LED 14 into longer wavelength light corresponding to one of the three colors. In the example illustrated by FIGS. 3A-3H, the color conversion agent 36 converts the UV light from the micro-LED 14 into blue light. The color conversion agent 36 can include quantum dots, nanostructures, organic or inorganic florescence molecules, or other suitable materials.

Optionally, the first photo-curable fluid 30a can include a solvent 37, e.g., water, ethanol, toluene or methylethylketone, or a combination thereof. The solvent can be organic or inorganic. The solvent can be selected to provide a desired surface tension and/or viscosity for the first photo-curable fluid 30a. The solvent can also improve chemical stability of the other components.

Optionally, the first photo-curable fluid 30a can include one or more other functional ingredients 38. As one example, the functional ingredients can affect the optical properties of the color conversion layer. For example, the functional ingredients can include nano-particles with a sufficiently high index of refraction that the color conversion layer functions as an optical layer that adjusts the optical path of the output light, e.g., provides a microlens. Alternately or in addition, the nano-particles can have an index of refraction selected such that the color conversion layer functions as an optical layer that reduces total reflection loss, thereby improving light extraction. As another example, the functional ingredients can be a surfactant to adjust the surface tension of the fluid 30a.

Returning to FIG. 3A, the first photo-curable fluid 30a can be deposited on the display over the micro-LED array by a spin-on, dipping, spray-on, or inkjet process. An inkjet process can be more efficient in consumption of the first photo-curable fluid 30a.

Figure 3B:
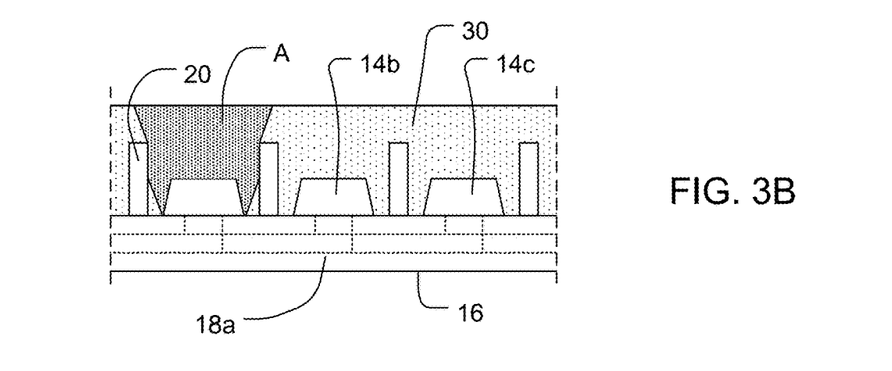

Next, as shown in FIG. 3B, the circuitry of the backplane 16 is used to selectively activate a first plurality of micro-LEDs 14a. This first plurality of micro-LEDs 14a correspond to the sub-pixels of a first color. In particular, the first plurality of micro-LEDs 14a correspond to the sub-pixels for the color of light to be generated by the color conversion components in the photo-curable fluid 30a. For example, assuming the color conversion component in the fluid 30a will convert light from the micro-LED 14 into blue light, then only those micro-LEDs 14a that correspond to blue sub-pixels are turned on. Because the micro-LED array is already integrated with the backplane circuitry 18, power can be supplied to the micro-LED display 10 and control signals can be applied by a microprocessor to selectively turn on the micro-LEDs 14a.

Figure 3C:
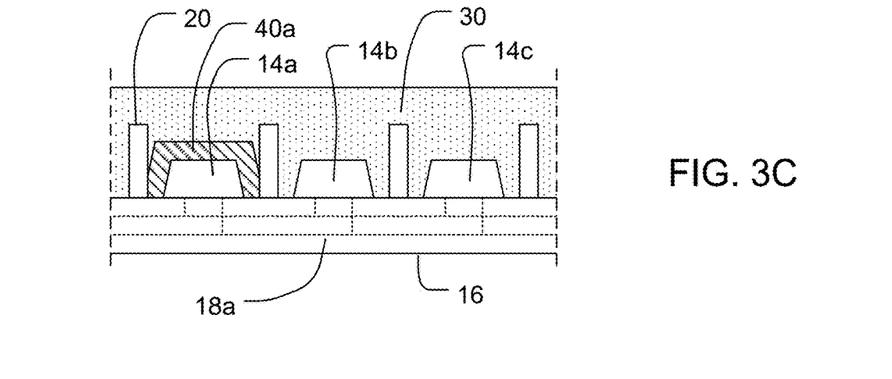

Referring to FIGS. 3B and 3C, activation of the first plurality of micro-LEDs 14a generates illumination A (see FIG. 3B) which causes in-situ curing of the first photo-curable fluid 30a to form a first solidified color conversion layer 40a (see FIG. 3C) over each activated micro-LED 14a. In short, the fluid 30a is cured to form color conversion layers 40a, but only on the selected micro-LEDs 14a. For example, a color conversion layer 40a for converting to blue light can be formed on each micro-LED 14a.

In some implementations, the curing is a self-limiting process. For example, illumination, e.g., UV illumination, from the micro-LEDs 14a can have a limited penetration depth into the photo-curable fluid 30a. As such, although FIG. 3B illustrates the illumination A reaching the surface of the photo-curable fluid 30a, this is not necessary. In some implementations, the illumination from the selected micro-LEDs 14a does not reach the other micro-LEDs 14b, 14c. In this circumstance, the isolation walls 20 may not be necessary.

However, if the spacing between the micro-LEDs 14 is sufficiently small, isolation walls 20 can affirmatively block illumination A from the selected micro-LED 14a from reaching the area over the other micro-LEDs that would be within the penetration depth of the illumination from those other micro-LEDs. Isolation walls 20 can also be included, e.g., simply as insurance against illumination reaching the area over the other micro-LEDs.

The driving current and drive time for the first plurality of micro-LEDs 14a can be selected for appropriate photon dosage for the photo-curable fluid 30a. The power per subpixel for curing the fluid 30a is not necessarily the same as the power per subpixel in a display mode of the micro-LED display 10. For example, the power per subpixel for the curing mode can be higher than the power per subpixel for the display mode.

Figure 3D:
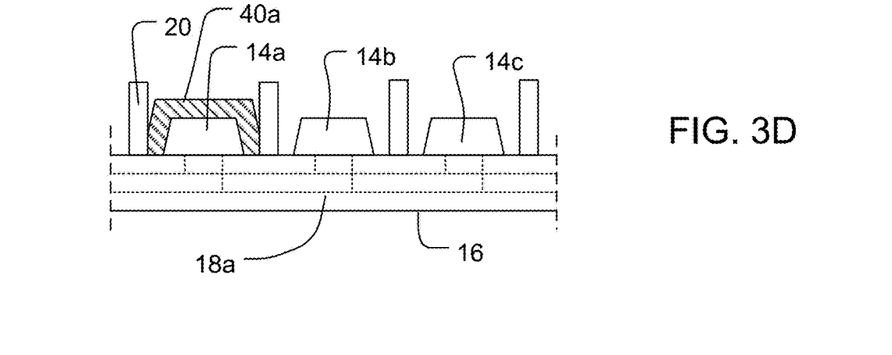

Referring to FIG. 3D, when curing is complete and the first solidified color conversion layer 40a is formed, the residual uncured first photo-curable fluid is removed from the display 10. This leaves the other micro-LEDs 14b, 14c, exposed for the next deposition steps. In some implementations, the uncured first photo-curable fluid 30a is simply rinsed from the display with a solvent, e.g., water, ethanol, toluene or methylethylketone, or a combination thereof. If the photo-curable fluid 30a includes a negative photoresist, then the rinsing fluid can include a photoresist developer for the photoresist.

Figure 3E:
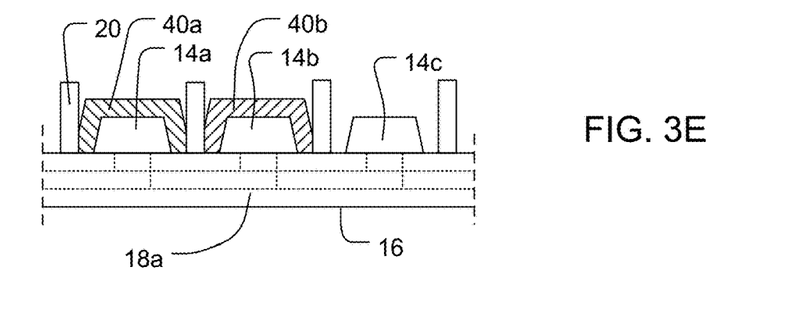
Figure 4B:
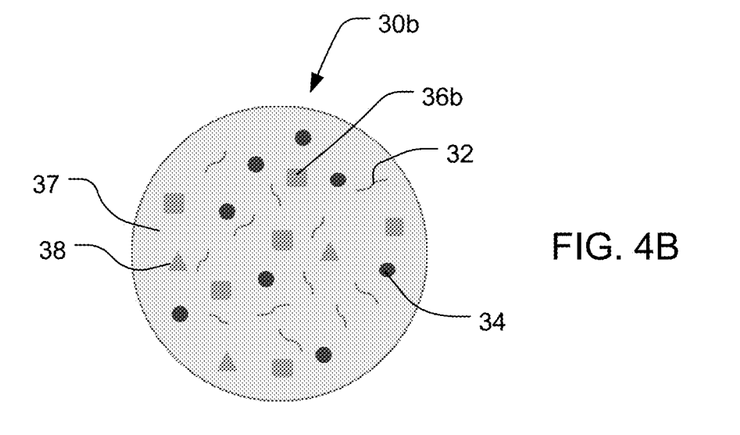

Referring to FIGS. 3E and 4B, the treatment described above with respect to FIGS. 3A-3D is repeated, but with a second photo-curable fluid 30b and activation of a second plurality of micro-LEDs 14b. After rinsing, a second color conversion layer 40b is formed over each of the second plurality of micro-LEDs 14b.

The second photo-curable fluid 30b is similar to the first photo-curable fluid 30a, but includes color conversion agents 36b to convert the shorter wavelength light from the micro-LEDs 14 into longer wavelength light of a different second color. The second color can be, for example, green.

The second plurality of micro-LEDs 14b correspond to the sub-pixels of a second color. In particular, the second plurality of micro-LEDs 14b correspond to the sub-pixels for the color of light to be generated by the color conversion components in the second photo-curable fluid 30b. For example, assuming the color conversion component in the fluid 30b will convert light from the micro-LED 14 into green light, then only those micro-LEDs 14b that correspond to green sub-pixels are turned on.

Figure 3F:
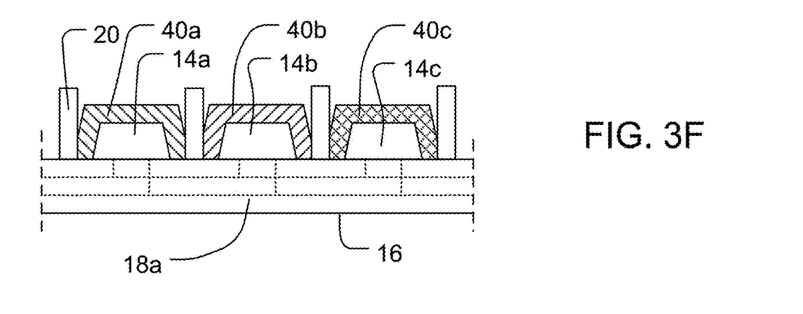
Figure 4C:
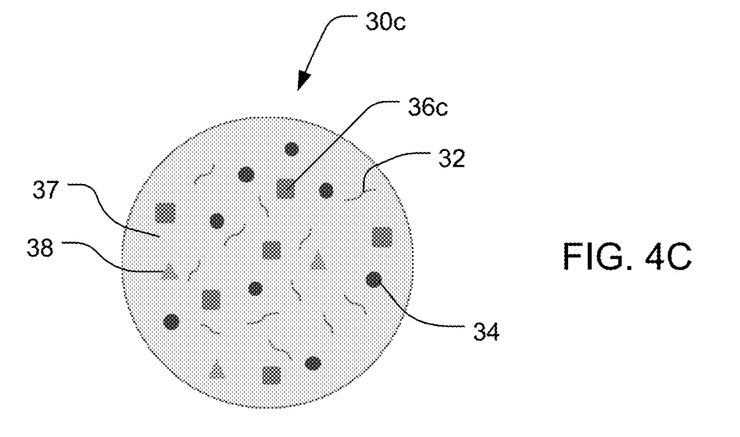

Referring to FIGS. 3F and 4C, optionally the treatment described above with respect to FIGS. 3A-3D is repeated yet again, but with a third photo-curable fluid 30c and activation of a third plurality of micro-LEDs 14c. After rinsing, a third color conversion layer 40c is formed over each of the third plurality of micro-LEDs 14c.

The third photo-curable fluid 30c is similar to the first photo-curable fluid 30a, but includes color conversion agents 36c to convert the shorter wavelength light from the micro-LEDs 14 into longer wavelength light of a different third color. The third color can be, for example, red.

The third plurality of micro-LEDs 14c correspond to the sub-pixels of a third color. In particular, the third plurality of micro-LEDs 14c correspond to the sub-pixels for the color of light to be generated by the color conversion components in the third photo-curable fluid 30c. For example, assuming the color conversion component in the fluid 30c will convert light from the micro-LED 14 into red light, then only those micro-LEDs 14c that correspond to red sub-pixels are turned on.

In this specific example illustrated in FIGS. 3A-3F, color conversion layers 40a, 40b, 40c are deposited for each color sub-pixel. This is needed, e.g., when the micro-LEDs generate ultraviolet light.

However, the micro-LEDs 14 could generate blue light instead of UV light. In this case, the coating of the display 10 by a photo-curable fluid containing blue color conversion agents can be skipped, and the process can be performed using the photo-curable fluids for the green and red subpixels. One plurality of micro-LEDs is left without a color conversion layer, e.g., as shown in FIG. 3E. The process shown by FIG. 3F is not performed. For example, the first photo-curable fluid 30a could include green CCAs and the first plurality 14a of micro-LEDs could correspond to the green subpixels, and the second photo-curable fluid 30b could include red CCAs and the second plurality 14b of micro-LEDs could correspond to the red subpixels.

Figure 3G:
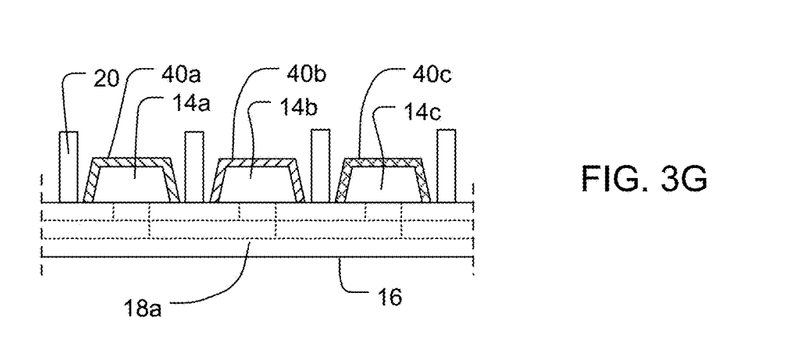

Assuming that the fluids 30a, 30b, 30c included a solvent, some solvent may be trapped in the color conversion layers 40a, 40b, 40c. Referring to FIG. 3G, this solvent can be evaporated, e.g., by exposing the micro-LED array to heat, such as by IR lamps. Evaporation of the solvent from the color conversion layers 40a, 40b, 40c can result in shrinking of the layers so that the final layers are thinner.

Removal of the solvent and shrinking of the color conversion layers 40a, 40b, 40c can increase concentration of color conversion agents, e.g., quantum dots, thus providing higher color conversion efficiency. On the other hand, including a solvent permits more flexibility in the chemical formulation of the other components of the photo-curable fluids, e.g., in the color conversion agents or cross-linkable components.

Figure 3H:
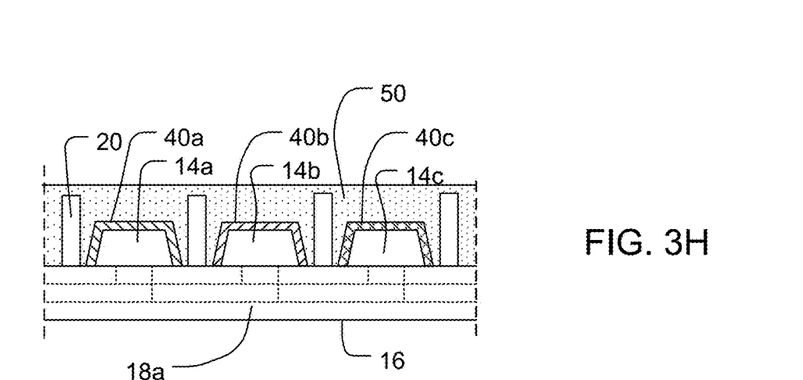

Optionally, as shown in FIG. 3H, a UV blocking layer 50 can be deposited on top of all of the micro-LEDs 14. The UV blocking layer 50 can block UV light that is not absorbed by the color conversion layers 40. The UV blocking layer 50 can be a Bragg reflector, or can simply be a material that is selectively absorptive to UV light. A Bragg reflector can reflect UV light back toward the micro-LEDs 14, thus increasing energy efficiency.

Figure 5A:
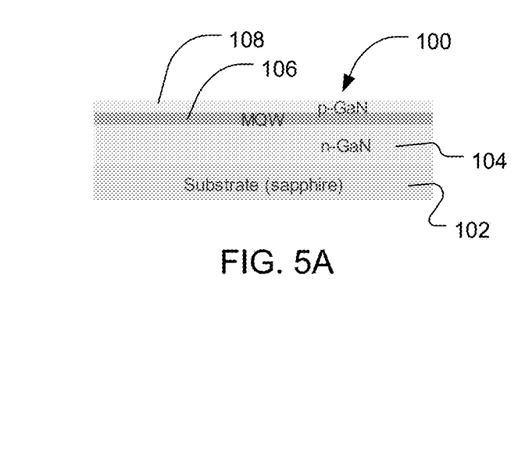
FIGS. 5A-5E illustrate a method of fabricating a micro-LED array and isolation walls on a backplane.

FIGS. 5A-5E illustrate a method of fabricating a micro-LED array and isolation walls on a backplane. Referring to FIG. 5A, the process starts with the wafer 100 that will provide the micro-LED array. The wafer 100 includes a substrate 102, e.g., a silicon or a sapphire wafer, on which are disposed a first semiconductor layer 104 having a first doping, an active layer 106, and a second semiconductor layer 108 having a second opposite doping. For example, the first semiconductor layer 104 can be an n-doped gallium nitride (n-GaN) layer, the active layer 106 can be a multiple quantum well (MQVV) layer 106, and the second semiconductor layer 107 can be an p-doped gallium nitride (p-GaN) layer 108.

Figure 5B:
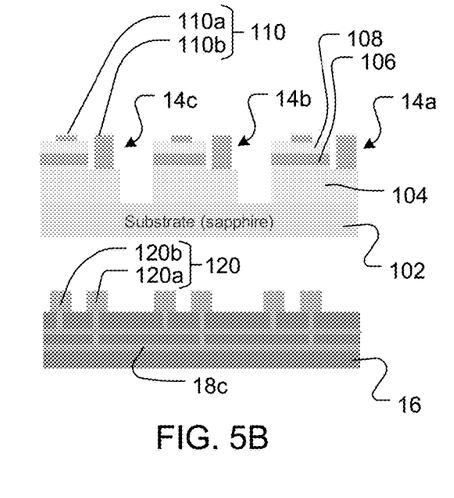

Referring to FIG. 5B, the wafer 100 is etched to divide the layers 104, 106, 108 into individual micro-LEDs 14, including the first, second and third plurality of micro-LEDs 14a, 14b, 14c that correspond to the first, second and third colors. In addition, conductive contacts 110 can be deposited. For example, a p-contact 110a and an n-contact 110b can be deposited onto the n-GaN layer 104 and p-GaN layer 108, respectively.

Similarly, the backplane 16 is fabricated to include the circuitry 18, as well as electrical contacts 120. The electrical contacts 120 can include first contacts 120a, e.g., drive contacts, and second contacts 120b, e.g., ground contacts.

Figure 5C:
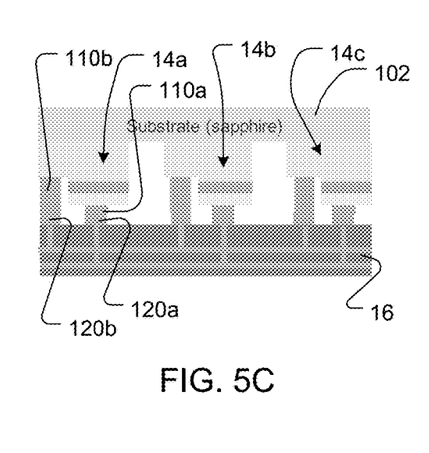

Referring to FIG. 5C, the micro-LED wafer 100 is aligned and placed in contact with the backplane 16. For example, the first contacts 110a can contact the first contacts 120a, and the second contacts 110b can contact the second contacts 120b. The micro-LED wafer 100 could be lowered into contact with the backplane, or vice-versa.

Figure 5D:
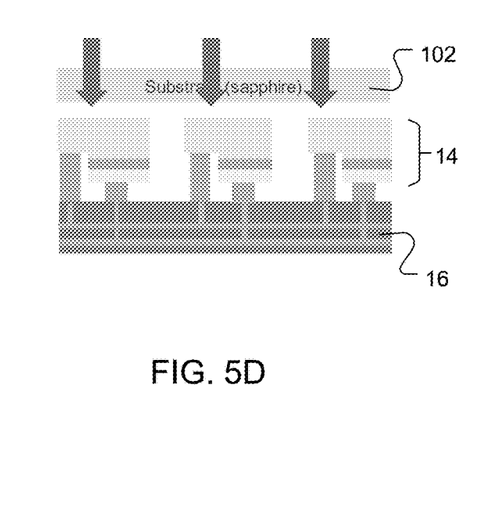

Next, referring to FIG. 5D, the substrate 102 is removed. For example, a silicon substrate can be removed by polishing away the substrate 102, e.g., by chemical mechanical polishing. As another example, a sapphire substrate can be removed by a laser liftoff process.

Figure 5E:
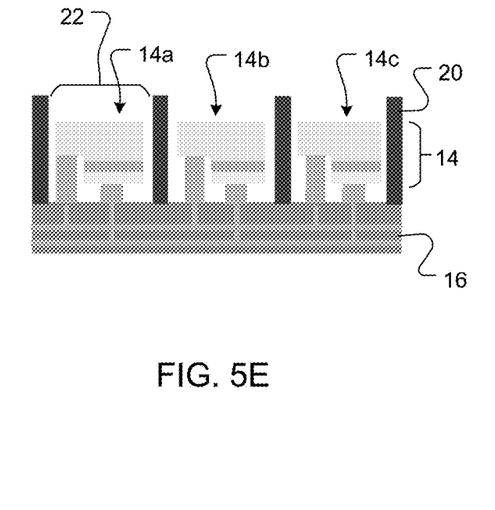

Finally, referring to FIG. 5E, the isolation walls 20 are formed on the backplane 16 (to which the micro-LEDs 14 are already attached). The isolation walls can be formed by a conventional process such as deposition of photoresist, patterning of the photoresist by photolithography, and development to remove the portions of the photoresist corresponding to the recesses 22. The resulting structure can then be used as the display 10 for the processed described for FIGS. 3A-3H.

FIGS. 6A-6D illustrate another method of fabricating a micro-LED array and isolation walls on a backplane. This process can be similar to the process discussed above for FIGS. 5A-5E, except as noted below.

Figure 6A:
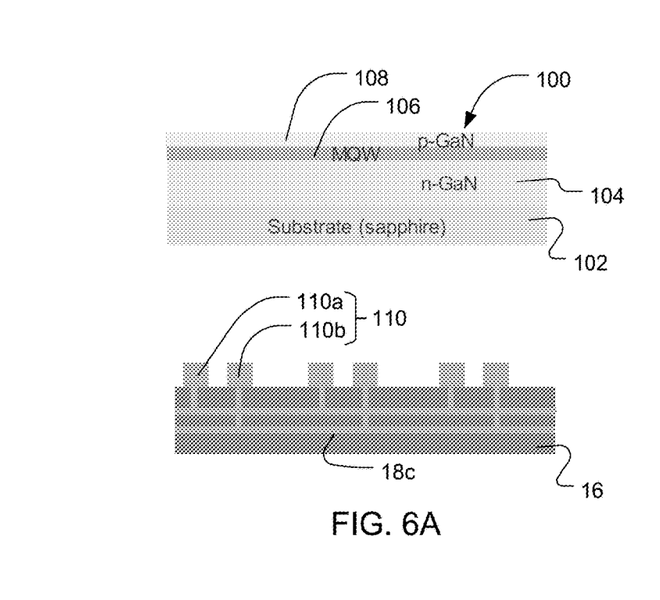
FIGS. 6A-6D illustrate another method of fabricating a micro-LED array and isolation walls on a backplane.

Referring to FIG. 6A, the process starts similarly to the process described above, with the wafer 100 that will provide the micro-LED array and the backplane 16.

Figure 6B:
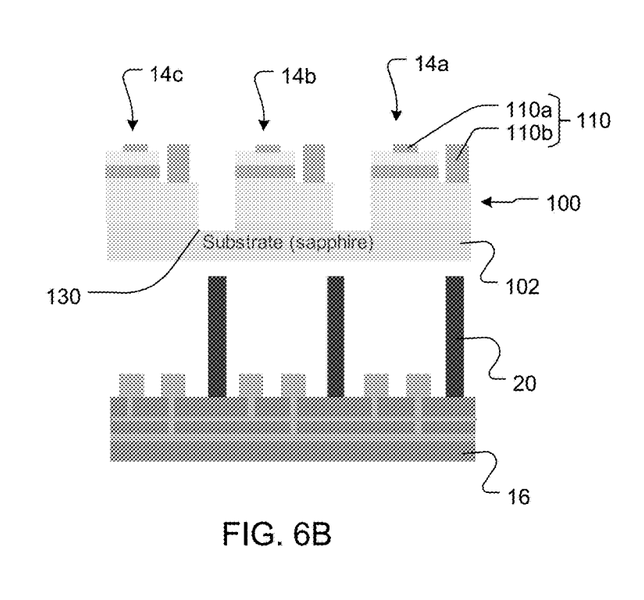

Referring to FIG. 6B, the isolation walls 20 are formed on the backplane 16 (to which the micro-LEDs 14 are not yet attached).

In addition, the wafer 100 is etched to divide the layers 104, 106, 108 into individual micro-LEDs 14, including the first, second and third plurality of micro-LEDs 14a, 14b, 14c. However, the recesses 130 formed by this etching process are sufficiently deep to accommodate the isolation walls 20. For example, the etching can continue so that the recesses 130 extend into the substrate 102.

Figure 6C:
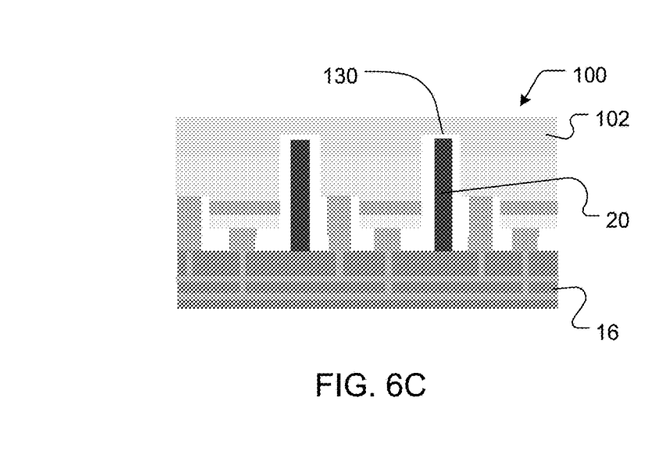

Next, as shown in FIG. 6C, the micro-LED wafer 100 is aligned and placed in contact with the backplane 16 (or vice-versa). The isolation walls 20 fit into the recesses 130. In addition, the contacts 110 of the micro-LEDs are electrically connected to the contacts 120 of the backplane 16.

Figure 6D:
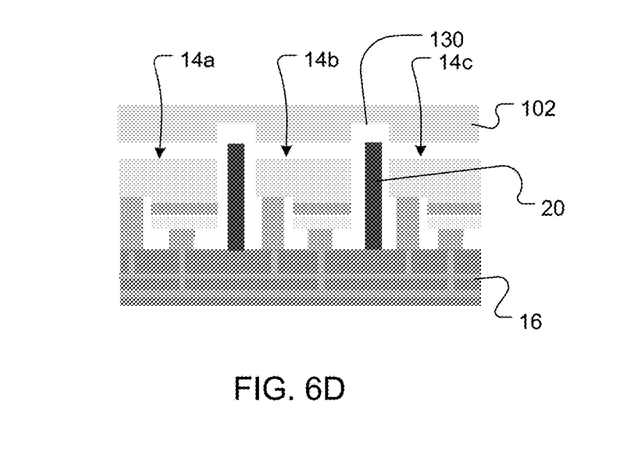

Finally, referring to FIG. 6D, the substrate 102 is removed. This leaves the micro-LEDs 14 and isolation walls 20 on the backplane 16. The resulting structure can then be used as the display 10 for the processed described for FIGS. 3A-3H.

Terms of positioning, such as vertical and lateral, have been used. However, it should be understood that such terms refer to relative positioning, not absolute positioning with respect to gravity. For example, laterally is a direction parallel to a substrate surface, whereas vertically is a direction normal to the substrate surface.

It will be appreciated to those skilled in the art that the preceding examples are exemplary and not limiting. For example:

Although the above description focuses on micro-LEDs, the techniques can be applied to other displays with other types of light emitting diodes, particularly displays with other micro-scale light emitting diodes, e.g., LEDs less than about 10 microns across.

Although the above description assumes that the order in which the color conversion layers are formed is blue, then green, then red, other orders are possible, e.g., blue, then red, then green. In addition, other colors are possible, e.g., orange and yellow.

It will be understood that various modifications may be made without departing from the spirit and scope of the present disclosure.

What is claimed is:

1. A method of fabricating a multi-color display, comprising:
    forming a plurality of isolation walls on a backplane that has backplane circuitry;
    providing a substrate having an array of light emitting diodes disposed thereon;
    moving the substrate relative to the backplane to bring the array of light emitting diodes into contact with the backplane such that the isolation walls formed on the backplane separate adjacent light emitting diodes and extend above a height of the light emitting diodes;
    electrically integrating the array of light emitting diodes with the backplane circuitry of the backplane;
    removing the substrate such that the array of light emitting diodes remain on the backplane;
    disposing a first photo-curable fluid that includes a first color conversion agent into recesses between the isolation walls and over a first plurality of light emitting diodes from the array of light emitting diodes; and
    curing the first photo-curable fluid over the first plurality of light emitting diodes to form a first color conversion layer over each of the first plurality of light emitting diodes to convert light from the first plurality of light emitting diodes to light of a first color.

2. The method of claim 1, further comprising:
    disposing a second photo-curable fluid that includes a second color conversion agent into recesses between isolation walls and over a second plurality of light emitting diodes from the array of light emitting diodes; and
    curing the second photo-curable fluid over the second plurality of light emitting diodes to form a second color conversion layer over each of the second plurality of light emitting diodes to convert light from the second plurality of light emitting diodes to light of a second color.

3. The method of claim 2, further comprising:
    disposing a third photo-curable fluid that includes a third color conversion agent into recesses between isolation walls and over a third plurality of light emitting diodes from the array of light emitting diodes; and
    curing the third photo-curable fluid over the third plurality of light emitting diodes to form a third color conversion layer over each of the third plurality of light emitting diodes to convert light from the third plurality of light emitting diodes to light of a third color.

4. The method of claim 3, wherein the first color, second color and third color are selected from blue, green and red.

5. The method of claim 1, wherein dispensing the first photo-curable fluid includes one or more of a spin-on, dipping, spray-on, or inkjet process.

6. The method of claim 5, wherein dispensing the first photo-curable fluid comprises an inkjet process.

7. The method of claim 1, wherein moving the substrate relative to the backplane causes the plurality of isolation walls to extend into recesses in the substrate.

8. The method of claim 1, wherein forming the plurality of isolation walls comprises deposition of a photoresist on the backplane, patterning of the photoresist by photolithography, and development to remove portions of the photoresist corresponding to the recesses.

9. The method of claim 1, wherein forming the plurality of isolation walls comprises deposition of a metal and lithography.

10. The method of claim 1, wherein the isolation walls are formed to have a height of 3 to 20 μm.

11. The method of claim 1, wherein the isolation walls are formed to have a width W of 2 to 10 μm.

12. The method of claim 1, wherein the isolation walls are formed to have an aspect ratio of 1.5:1 to 5:1.

13. The method of claim 1, wherein light emitting diodes of the array of light emitting diodes are semiconductor micro-LEDs.

14. The method of claim 13, wherein the semiconductor micro-LEDs comprise III-V semiconductor LEDs.

15. The method of claim 1, wherein dispensing the first photo-curable fluid fills gaps between the light emitting diodes and the isolation walls.

16. The method of claim 1, wherein material of the isolation walls is absent from between the backplane and the light emitting diodes.

* * * * *